United States Patent
Gill (10) Patent No.: US 7,154,716 B2
(45) Date of Patent: Dec. 26, 2006

(54) TUNNEL VALVE FREE LAYER STABILIZATION SYSTEM AND METHOD USING ADDITIONAL CURRENT IN LEAD

(75) Inventor: Hardayal Singh Gill, Palo Alto, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 376 days.

(21) Appl. No.: 10/452,561

(22) Filed: May 30, 2003

(65) Prior Publication Data

US 2004/0240122 A1 Dec. 2, 2004

(51) Int. Cl.
G11B 5/33 (2006.01)

(52) U.S. Cl. .............................. 360/324.2; 360/324.12

(58) Field of Classification Search ................. 95/1, 95/14, 273, 278; 96/397, 417, 420, 383; 55/282.4, 385.2, 523, DIG. 10, DIG. 30; 60/311; 73/38, 40, 40.5 A, 40.5 R, 49.7; 360/324.2, 324.11, 324.12, 324.1, 324
See application file for complete search history.

(56) References Cited

U.S. PATENT DOCUMENTS

| 5,729,410 | A | * | 3/1998 | Fontana, Jr. et al. ..... | 360/324.2 |
|---|---|---|---|---|---|
| 6,266,218 | B1 | | 7/2001 | Carey et al. ........... | 360/324.12 |
| 6,724,582 | B1 | * | 4/2004 | Funayama et al. ....... | 360/324.1 |
| 2002/0015268 | A1 | * | 2/2002 | Mao et al. ............. | 360/324.12 |
| 2002/0027763 | A1 | * | 3/2002 | Ishiwata et al. ......... | 360/324.2 |
| 2002/0064004 | A1 | | 5/2002 | Worledge ................ | 360/324.2 |
| 2003/0048585 | A1 | * | 3/2003 | Gill ....................... | 360/324.12 |
| 2003/0133234 | A1 | * | 7/2003 | Furukawa et al. ..... | 360/324.12 |
| 2003/0161080 | A1 | * | 8/2003 | Ishikawa et al. ....... | 360/324.12 |
| 2003/0179515 | A1 | * | 9/2003 | Pinarbasi ............... | 360/324.11 |
| 2003/0193761 | A1 | * | 10/2003 | Cornwell et al. ...... | 360/324.12 |
| 2004/0105195 | A1 | * | 6/2004 | Fontana et al. ........ | 360/324.12 |

FOREIGN PATENT DOCUMENTS

JP        2001084531 A    *    3/2001

* cited by examiner

Primary Examiner—William J Klimowicz
(74) Attorney, Agent, or Firm—Zilka-Kotab, PC (57) ABSTRACT

A magnetic tunnel junction (MTJ) sensor system and a method for fabricating the same. A sensor includes a pinned layer, a free layer, and a tunnel barrier layer positioned between the pinned layer and the free layer. The pinned layer, the free layer, and the tunnel barrier layer define a track width. The pinned layer, the free layer, and the tunnel barrier layer are positioned between first and second lead layers. A pair of hard bias layers generate a hard bias magnetic field. Insulating layers are positioned between the hard bias layers and the first and second lead layers. In use, a sensor magnetic field generated by the current is opposite and substantially equal to the hard bias magnetic field at a center of the track width of the sensor.

22 Claims, 7 Drawing Sheets

TUNNEL VALVE FREE LAYER STABILIZATION SYSTEM AND METHOD USING ADDITIONAL CURRENT IN LEAD

FIELD OF THE INVENTION

The present invention relates to magnetic tunnel junction sensors for reading signals recorded in a magnetic storage medium, and more particularly, this invention relates to stabilizing a magnetic tunnel junction sensor.

BACKGROUND OF THE INVENTION

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive (MR) read sensors, commonly referred to as MR sensors, are the prevailing read sensors because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

Figure 1:
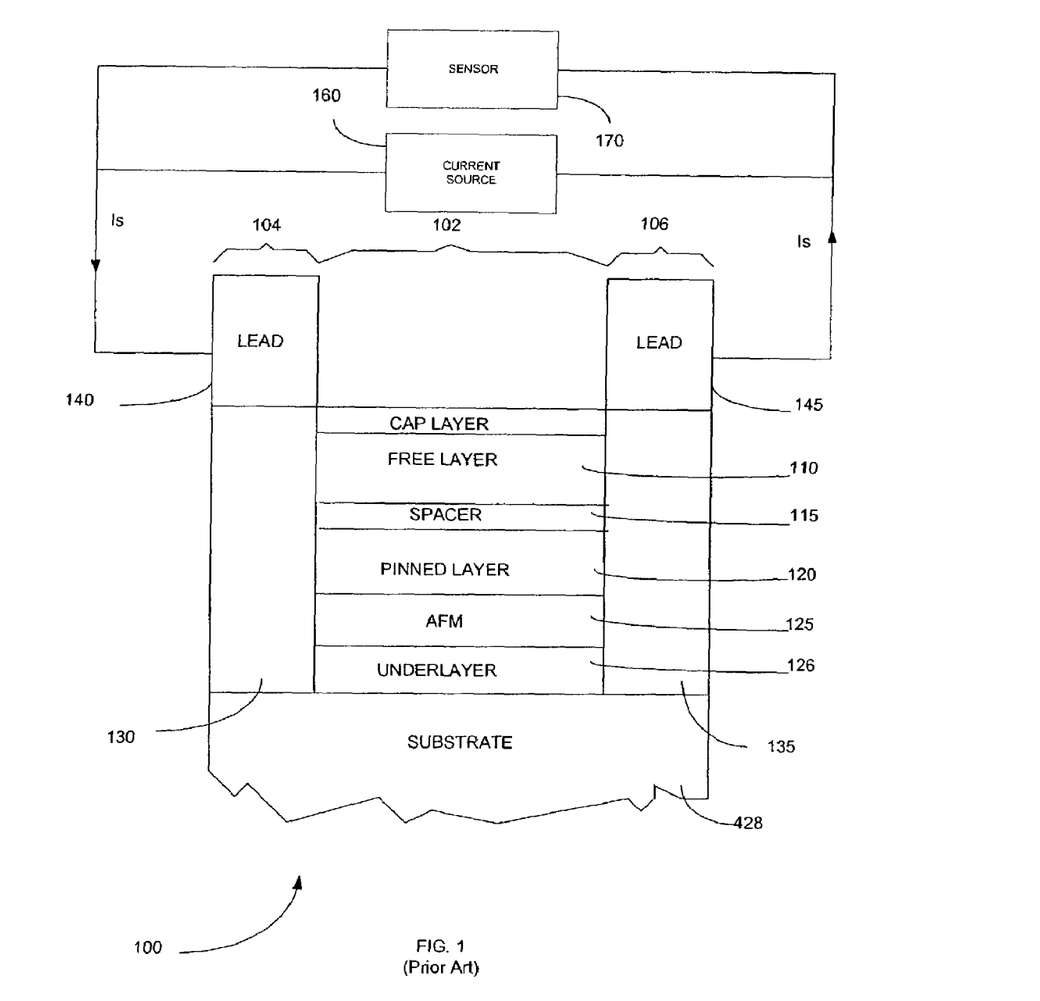
FIG. 1 is a schematic diagram of the cross-section of a prior art magnetoresistive read (MR) sensor, not drawn to scale.

Prior Art FIG. 1 shows a typical spin valve sensor 100 (not drawn to scale) comprising end regions 104 and 106 separated by a central region 102. The central region 102 has defined edges and the end regions are contiguous with and abut the edges of the central region. A free layer (free ferromagnetic layer) 110 is separated from a pinned layer (pinned ferromagnetic layer) 120 by a non-magnetic, electrically-conducting spacer 115. The magnetization of the pinned layer 120 is fixed through exchange coupling with an antiferromagnetic (AFM) 125. An underlayer 126 is positioned below the AFM layer 125.

The underlayer 126, or seed layer, is any layer deposited to modify the crystallographic texture or grain size of the subsequent layers, and may not be needed depending on the substrate. A variety of oxide and/or metal materials have been employed to construct underlayer 126 for improving the properties of spin valve sensors. Often, the underlayer 126 may be formed of tantalum (Ta), zirconium (Zr), hafnium (Hf), or yttrium (Y). Ideally, such layer comprises NiFeCr in order to further improve operational characteristics.

Free layer 110, spacer 115, pinned layer 120, the AFM layer 125, and the underlayer 126 are all formed in the central region 102. Hard bias layers 130 and 135 formed in the end regions 104 and 106, respectively, provide longitudinal bias for the free layer 110. Leads 140 and 145 formed over hard bias layers 130 and 135, respectively, provide electrical connections for the flow of the sensing current $I_s$ from a current source 160 to the MR sensor 100. Sensor 170 is connected to leads 140 and 145 senses the change in the resistance due to changes induced in the free layer 110 by the external magnetic field (e.g., field generated by a data bit stored on a disk). IBM's U.S. Pat. No. 5,206,590 granted to Dieny et al. and incorporated herein by reference, discloses an MR sensor operating on the basis of the spin valve effect.

Another type of magnetic device currently under development is a magnetic tunnel junction (MTJ) device. The MTJ device has potential applications as a memory cell and as a magnetic field sensor. The MTJ device comprises two ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetic moments, or magnetization directions, of the two ferromagnetic layers. In the MTJ sensor, one ferromagnetic layer has its magnetic moment fixed, or pinned, and the other ferromagnetic layer has its magnetic moment free to rotate in response to an external magnetic field from the recording medium (the signal field). When an electric potential is applied between the two ferromagnetic layers, the sensor resistance is a function of the tunneling current across the insulating layer between the ferromagnetic layers. Since the tunneling current that flows perpendicularly through the tunnel barrier layer depends on the relative magnetization directions of the two ferromagnetic layers, recorded data can be read from a magnetic medium because the signal field causes a change of direction of magnetization of the free layer, which in turn causes a change in resistance of the MTJ sensor and a corresponding change in the sensed current or voltage. IBM's U.S. Pat. No. 5,650,958 granted to Gallagher et al., incorporated in its entirety herein by reference, discloses an MTJ sensor operating on the basis of the magnetic tunnel junction effect.

Figure 2:
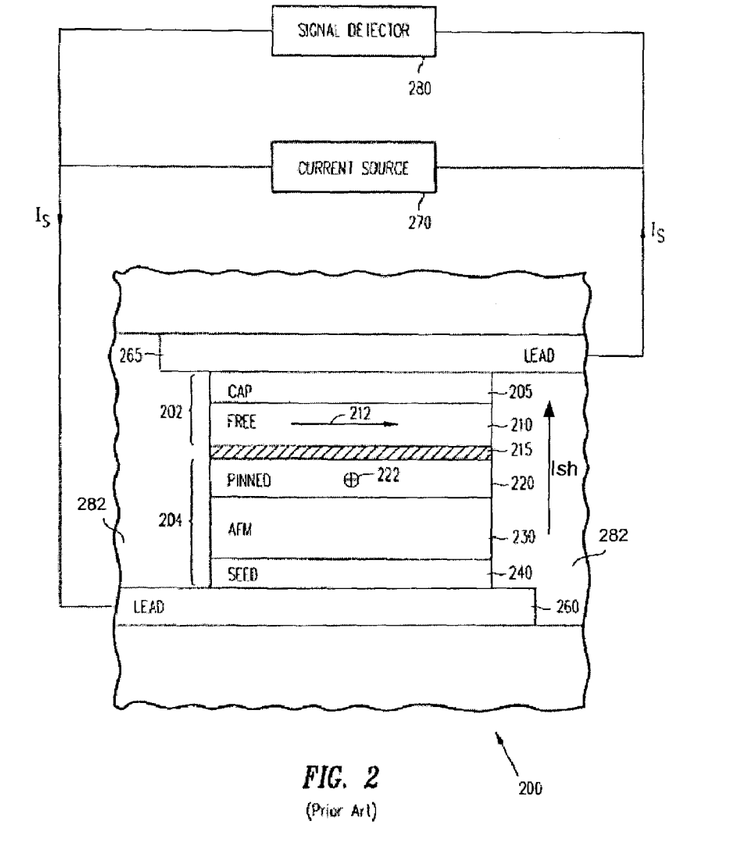
FIG. 2 shows a prior art magnetic tunnel junction (MTJ) sensor, not drawn to scale.

Prior Art FIG. 2 shows a prior art MTJ sensor 200 comprising a first electrode 204, a second electrode 202, and a tunnel barrier 215. The first electrode 204 comprises a pinned layer (pinned ferromagnetic layer) 220, an antiferromagnetic (AFM) layer 230, and a seed layer 240. The magnetization of the pinned layer 220 is fixed through exchange coupling with the AFM layer 230. The second electrode 202 comprises a free layer (free ferromagnetic layer) 210 and a cap layer 205. The free layer 210 is separated from the pinned layer 220 by a non-magnetic, electrically insulating tunnel barrier layer 215. In the absence of an external magnetic field, the free layer 210 has its magnetization oriented in the direction shown by arrow 212, that is, generally perpendicular to the magnetization direction of the pinned layer 220 shown by arrow 222 (tail of an arrow pointing into the plane of the paper). A first lead 260 and a second lead 265 formed in contact with first electrode 204 and second electrode 202, respectively, provide electrical connections for the flow of sensing current Is from a current source 270 to the MTJ sensor 200. A signal detector 280, typically including a recording channel such as a partial-response maximum-likelihood (PRML) channel, connected to the first and second leads 260 and 265 senses the change in resistance due to changes induced in the free layer 210 by the external magnetic field.

Flanking each side of the electrodes (202, 204) are hard bias layers 282 which serve to promote stability of the MJT sensor 200 as well as provide a strong coupling between the ferromagnetic layers thereof. Typically, the hard bias layers 282 are traditionally constructed using a material that is at least partially conductive. Thus, an undesirable shunt current, Ish, flows between the first and second leads 260 and 265.

Figure 2A:
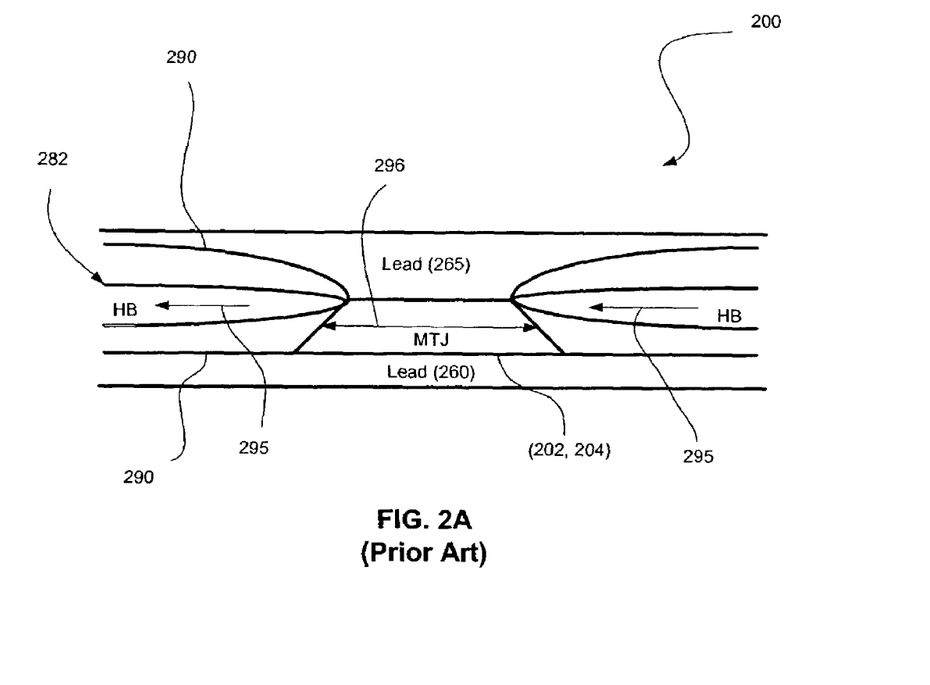
FIG. 2A shows the prior art MJT sensor of FIG. 2 with insulating layers.

Prior Art FIG. 2A shows the prior art MJT sensor 200 of FIG. 2 with insulating layers 290 to prevent the shunt current. As shown, the electrodes (202, 204) are coupled to the first and second leads 260 and 265, as set forth in FIG. 2. However, the insulating layers 290 provide an insulating buffer between the hard bias layers 282 and the first and second leads 260 and 265 to prevent the shunt current.

In use, the aforementioned hard bias layers 282 promote stability of the MJT sensor 200 by way of a hard bias magnetic field 295 (see FIG. 2A) along a track width 296 of the sensor 200. The strength of such hard bias magnetic field 295 is a function of a relationship between the thicknesses of the free layer 210 and hard bias layers 282 (see FIG. 2).

Figure 2B:
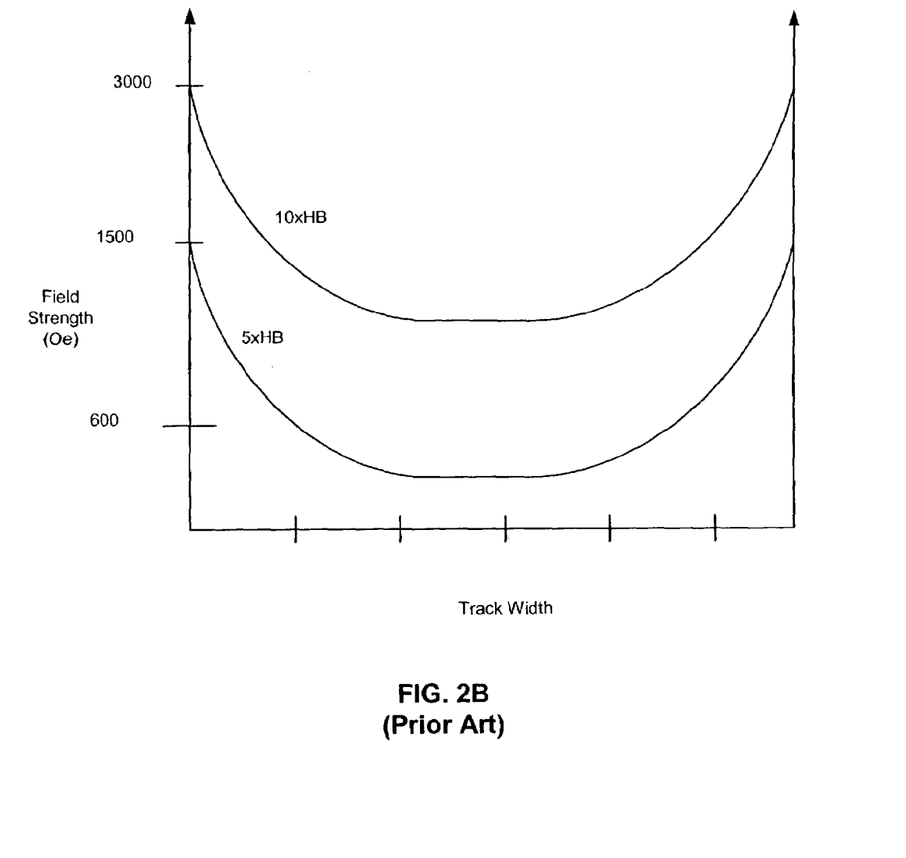
FIG. 2B illustrates a graph showing the strength of a hard bias magnetic field over the length of the track width of a sensor for two thickness relationships (i.e. where the thickness of the hard bias layers is 5 and 10 times that of the free layer).

Prior Art FIG. 2B illustrates a graph showing the strength of a hard bias magnetic field 295 over the length of the track width 296 of the sensor 200, for two thickness relationships (i.e. where the thickness of the hard bias layers 282 is 5 and 10 times that of the free layer 210). As shown, in both cases, the hard bias magnetic field 295 is greater adjacent ends of the track width 296 to promote the aforementioned stability. Moreover, the hard bias magnetic field 295 is less adjacent a center of the track width 296 to promote a sensitivity of the sensor 200.

There has been an on-going trend of manufacturing smaller sensors 200 with inherently shortly track widths 296. To ensure that the aforementioned stability is preserved (i.e. by maintaining the strength of the hard bias magnetic field 295 at the ends of the track width 296), the thickness of the hard bias layers 282 has not been reduced in concert with the foregoing trend of smaller sensors 200. Unfortunately, this has caused the strength of the hard bias magnetic field 295 to also be maintained at the center of the track width 296, resulting in reduced sensitivity. See, for example, the difference between the two cases shown in FIG. 2B (i.e. where the thickness of the hard bias layers 282 is 5 and 10 times that of the free layer 210).

There is thus a need for continuing with the aforementioned trend of smaller sensors and respectively large hard bias layers (to maintain stability), while also maintaining the sensitivity of the sensor.

DISCLOSURE OF THE INVENTION

A magnetic tunnel junction (MTJ) sensor system and a method for fabricating the same are provided. First provided are a first lead layer and a sensor (i.e. a tunnel valve sensor). The sensor includes a pinned layer, and a free layer adjacent to the pinned layer. The magnetization direction of the pinned layer is substantially perpendicular to the magnetization direction of the free layer at zero applied magnetic field. Further included as a component of the sensor is a tunnel barrier layer positioned between the pinned layer and the free layer. The pinned layer, the free layer, and the tunnel barrier layer define a track width.

Further included is a second lead layer, where the pinned layer, the free layer, and the tunnel barrier layer are positioned between the first lead layer and the second lead layer. In operation, the first lead layer and the second lead layer are adapted for conducting a current through the sensor. A pair of hard bias layers is positioned adjacent to the pinned layer, the free layer, and the tunnel barrier layer for generating a hard bias magnetic field. Also included are insulating layers positioned between the hard bias layers and the first lead layer and the second lead layer.

In use, a sensor magnetic field generated by the current is opposite and substantially equal to the hard bias magnetic field at a center of the track width of the sensor. In one embodiment, the current may be selected to ensure that the sensor magnetic field generated by the current is opposite and substantially equal to the hard bias magnetic field at the center of the track width of the sensor. Thus, a sensitivity of the sensor is enhanced.

In another embodiment, the current may include 5–10 mA of current. Optionally, the current may include 6–8 mA of current. Still yet, the current may include 7 mA of current.

In still another embodiment, a thickness of each of the hard bias layers may be at least five, eight, and/or ten times a thickness of the free layer of the sensor, in order to maintain a

BRIEF DESCRIPTION OF THE DRAWINGS

For a fuller understanding of the nature and advantages of the present invention, as well as the preferred mode of use, reference should be made to the following detailed description read in conjunction with the accompanying drawings.

Prior Art

Prior Art

Prior Art

Prior Art

BEST MODE FOR CARRYING OUT THE INVENTION

The following description is the best embodiment presently contemplated for carrying out the present invention. This description is made for the purpose of illustrating the general principles of the present invention and is not meant to limit the inventive concepts claimed herein.

Figure 3:
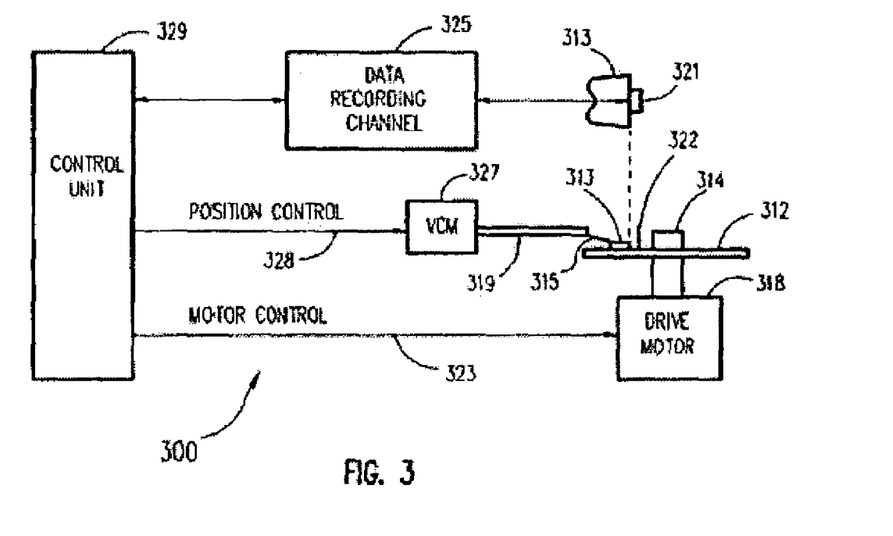
FIG. 3 is a perspective drawing of a magnetic recording disk drive system.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on disk 312.

At least one slider 313 is positioned on the disk 312, each slider 313 supporting one or more magnetic read/write heads 321 where the head 321 incorporates the magnetic tunnel junction (MTJ) sensor of the present invention. As the disks rotate, slider 313 is moved radially in and out over disk surface 322 so that heads 321 may access different portions of the disk where desired data are recorded. Each slider 313 is attached to an actuator arm 319 by way of a suspension 315. The suspension 315 provides a slight spring force which biases slider 313 against the disk surface 322. Each actuator arm 319 is attached to an actuator 327. The actuator 327 as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write heads 321 by way of recording channel 325.

The above description of a magnetic disk storage system of the present invention, and the accompanying illustration of FIG. 3 are for representation purposes only. It should be apparent that disk storage systems may contain a large number of disks and actuators, and each actuator may support a number of sliders.

Figure 4:
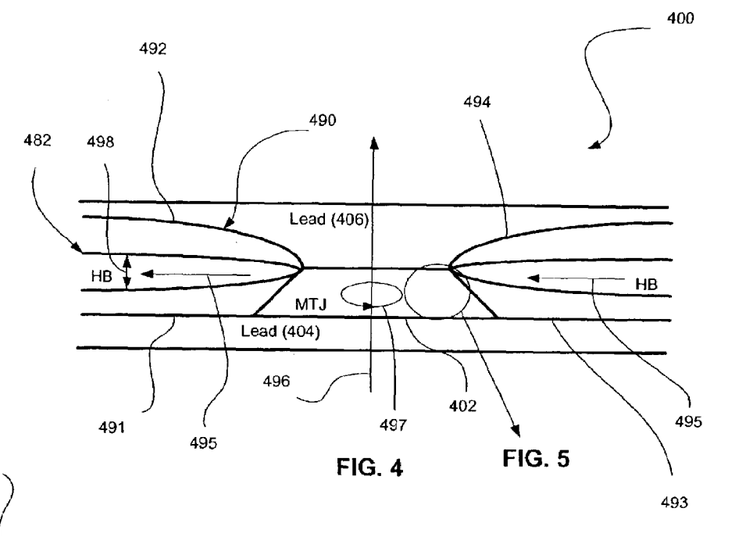
FIG. 4 is a MJT sensor system in accordance with one embodiment, not drawn to scale.

Now referring to FIG. 4, there is shown a MJT sensor system 400 (not drawn to scale), in accordance with one embodiment. While the present MJT sensor system 400 may be constructed in the context of the magnetic disk storage system of FIG. 3, it should be noted that the MJT sensor system 400 may be implemented in any desired context.

As shown, first provided are a first lead layer 404 and a second lead layer 406. Also included is a tunnel valve sensor 402 positioned between the first lead layer 404 and the second lead layer 406. More information regarding one exemplary tunnel valve sensor 402 construction will be set forth during reference to FIG. 5.

With continuing reference to FIG. 4, a pair of hard bias layers 482 flanks the tunnel valve sensor 402. As an option, the hard bias layers 482 may be constructed from CoPtCr, or any other desired effective material with a hard bias layer thickness 498. To prevent shunt currents from flowing, insulating layers 490 are positioned between the hard bias layers 482, and the first lead layer 404 and the second lead layer 406. Such insulating layers 490 may be constructed from a non-conductive, magnetic material. Just by way of example, the insulating layers 490 may be constructed using an $Al_2O_3$ material, Fe material, FeOx material, or another desired effective material.

In one embodiment, the insulating layers may include a first insulating layer 491 positioned between a bottom surface of a first one of the hard bias layers 482 and the first lead layer 404. Further a second insulating layer 492 may be provided which is positioned between a top surface of the first hard bias layer and the second lead layer 406. Also included may be a third insulating layer 493 positioned between a bottom surface of a second one of the hard bias layers 482 and the first lead layer 404. Still yet, a fourth insulating layer 494 may be positioned between a top surface of the second hard bias layer and the second lead layer 406. The insulating layers 490 serve for preventing a shunt current between the first lead layer 404 and the second lead layer 406 via the hard bias layers 482.

In use, the aforementioned hard bias layers 482 promote a stability of the MJT sensor 400 by way of a hard bias magnetic field 495 along a track width of the tunnel valve sensor 402. As set forth earlier, the strength of such hard bias magnetic field 495 is a function of a relationship between the thicknesses of a free layer of the tunnel valve sensor 402 and hard bias layers 482.

Moreover, a current 496 is applied to the tunnel valve sensor 402 via the first lead layer 404 and the second lead layer 406, in a direction perpendicular to the hard bias magnetic field 495. As shown in FIG. 4, a sensor magnetic field 497 generated by the current 496 (shown in accordance with the right-hand rule) is opposite to the hard bias magnetic field at a center of the track width, in an operable portion [i.e. front of the stripe—at the air bearing surface (ABS)] of the sensor 400. Moreover, the current 496 is selected to ensure that the sensor magnetic field 497 generated by the current 496 is opposite and substantially equal to the hard bias magnetic field 495 at the center of the track width of the tunnel valve sensor 402. More information will now be set forth regarding an exemplary construction of the tunnel valve sensor 402.

Figure 5:
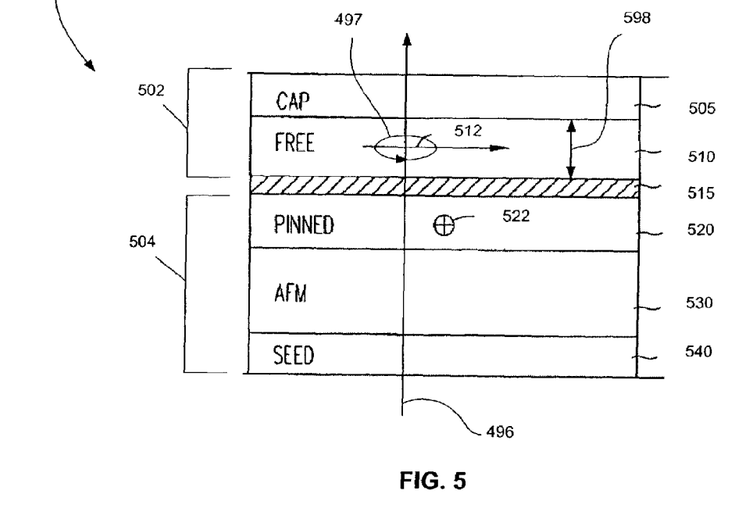
FIG. 5 shows various exemplary layers of the tunnel valve shown in FIG. 4 (not drawn to scale), in accordance with one exemplary embodiment.

FIG. 5 shows various exemplary layers of the tunnel valve sensor 402 shown in FIG. 4 (not drawn to scale), in accordance with one exemplary embodiment. It should be noted that the layers set forth in FIG. 5 are merely for illustrative purposes. Of course, any tunnel valve-type MR sensor may be utilized per the desires of the user.

As shown, the tunnel valve sensor 402 may include a first electrode 504, a second electrode 502, and a tunnel barrier 515. The first electrode 504 may include a pinned layer (pinned ferromagnetic layer) 520, an antiferromagnetic (AFM) layer 530, and a seed layer 540. The magnetization of the pinned layer 520 may be fixed through exchange coupling with the AFM layer 530.

The second electrode 502 may include a free layer (free ferromagnetic layer) 510 and a cap layer 505. The free layer 510 may be separated from the pinned layer 520 by the non-magnetic, electrically insulating tunnel barrier layer 515.

In the absence of an external magnetic field, the free layer 510 may have its magnetization oriented in the direction shown by arrow 512, that is, generally perpendicular to the magnetization direction of the pinned layer 520 shown by arrow 522 (tail of an arrow pointing into the plane of the paper). The first lead layer 404 and the second lead layer 406 (see FIG. 4) may be formed in contact with the first electrode 504 and second electrode 502, respectively, to provide electrical connections for the flow of the current 496 from a current source to the tunnel valve sensor 402. A signal detector, typically including a recording channel such as a partial-response maximum-likelihood (PRML) channel, may be connected to the first and second lead layers to sense the change in resistance due to changes induced in the free layer 510 by the external magnetic field.

Again, the sensor magnetic field 497 generated by the current 496 is opposite to the hard bias magnetic field at a center of the track width of the sensor. Moreover, the current 496 is selected to ensure that the sensor magnetic field 497 generated by the current 496 is opposite and substantially equal to the hard bias magnetic field 495 (see FIG. 4) at the center of the track width of the tunnel valve sensor 402, to promote sensor sensitivity in a manner that will soon be elaborated upon.

The current 496 may preferably include 5–10 mA of current to maintain the sensor sensitivity by ensuring that the sensor magnetic field 497 generated by the current 496 is opposite and substantially equal to the hard bias magnetic field 495 at the center of the track width of the sensor 402. More preferably, 6–8 mA of current 496 may be used to accomplish the foregoing objective. Still yet, most preferably, the current 496 may include 7 mA of current.

Still yet, a thickness of each of the hard bias layers 482 (see hard bias layer thickness 498 of FIG. 4) may be at least five, eight, and/or ten times a free layer thickness 598 of the tunnel valve sensor 402 to ensure optimal sensor stability.

Figure 6:
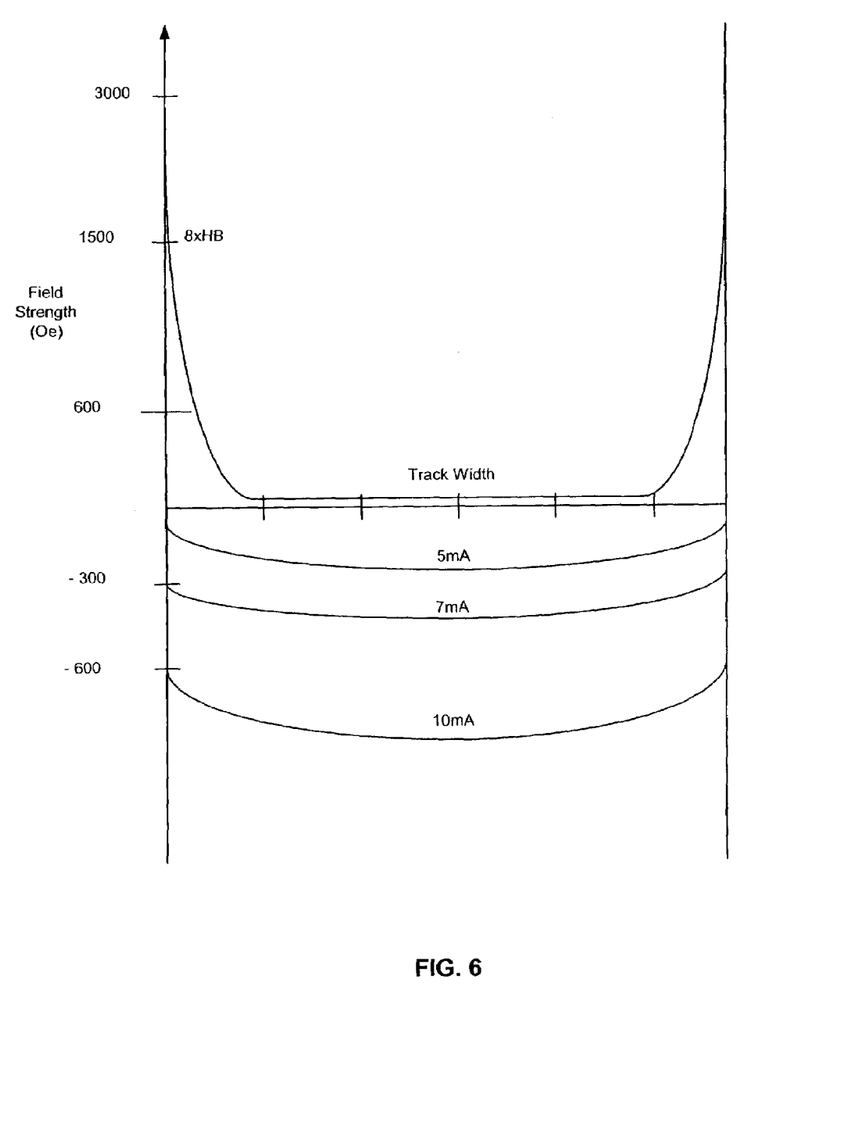
FIG. 6 illustrates a graph showing field strengths including various sensor magnetic field strengths produced by a range of currents, and a resultant hard bias magnetic field strength (where the hard bias layer thickness is 8 times the free layer thickness, and the current is 7 mA).

FIG. 6 illustrates a graph showing field strengths including various sensor magnetic field strengths produced by a range of currents 496 and a resultant hard bias magnetic field strength (where the hard bias layer thickness 498 is 8 times the free layer thickness 598, and the current 496 is 7 mA). As shown, such value of current 496 and thickness relationship renders a minimal hard bias magnetic field 495 at a center of the track width of the sensor 402, thus optimizing the sensitivity of the sensor 402. Moreover, by virtue of the thickness relationship (i.e. the hard bias layer thickness 498 is 8 times the free layer thickness 598), a maximum hard bias magnetic field 495 is achieved at ends of the track width of the sensor 402, thus optimizing the stability of the sensor 402.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A magnetic tunnel junction (MTJ) sensor device, comprising:
   a first lead layer;
   a sensor including;
      a pinned layer,
      a free layer adjacent to the pinned layer, the magnetization direction of the pinned layer being substantially perpendicular to the magnetization direction of the free layer at zero applied magnetic field,
      a tunnel barrier layer positioned between the pinned layer and the free layer,
      wherein the pinned layer, the free layer, and the tunnel barrier layer define a track width;
   a second lead layer, where the pinned layer, the free layer, and the tunnel barrier layer are positioned between the first lead layer and the second lead layer, the first lead layer and the second lead layer adapted for conducting a current through the sensor;
   a pair of hard bias layers adjacent to the pinned layer, the free layer, and the tunnel barrier layer for generating a hard bias magnetic field; and
   insulating layers positioned between the hard bias layers and the first lead layer and the second lead layer;
   wherein a sensor magnetic field generated by the current is opposite the hard bias magnetic field at a center of the track width of the sensor,
   wherein a thickness of each of the hard bias layers is at least five times a thickness of the free layer of the sensor.

2. The MTJ sensor device as recited in claim 1, wherein the current is selected to ensure that the sensor magnetic field generated by the current is opposite and substantially equal to the hard bias magnetic field at the center of the track width of the sensor.

3. The MTJ sensor device as recited in claim 1, wherein a thickness of each of the hard bias layers is at least eight times a thickness of the free layer of the sensor.

4. The MTJ sensor device as recited in claim 3, wherein a thickness of each of the hard bias layers is at least ten times a thickness of the free layer of the sensor.

5. The MTJ sensor device as recited in claim 1, wherein the current includes 5–10 mA of current.

6. The MTJ sensor device as recited in claim 5, wherein the current includes 6–8 mA of current.

7. The MTJ sensor device as recited in claim 6, wherein the current includes 7 mA of current.

8. The MTJ sensor device as recited in claim 1, wherein a sensitivity of the sensor device is enhanced by ensuring that the sensor magnetic field generated by the current is opposite and substantially equal to the hard bias magnetic field at the center of the track width of the sensor.

9. The MTJ sensor device as recited in claim 1, wherein at least one of the leads is at least as wide as the track width of the sensor.

10. The MTJ sensor device as recited in claim 1, wherein both of the leads are at least as wide as the track width of the sensor.

11. A method of using a magnetic tunnel junction (MTJ) sensor device including a first lead layer; a sensor including: a pinned layer, a free layer adjacent to the pinned layer, the magnetization direction of the pinned layer being substantially perpendicular to the magnetization direction of the free layer at zero applied magnetic field, a tunnel barrier layer positioned between the pinned layer and the free layer, wherein the pinned layer, the free layer, and the tunnel barrier layer define a track width; a second lead layer, where the pinned layer, the free layer, and the tunnel barrier are positioned between the first lead layer and the second lead layer, the first lead layer and the second lead layer adapted for conducting a current through the sensor; a pair of hard bias layers adjacent to the pinned layer, the free layer, and the tunnel barrier layer for generating a hard bias magnetic field; and insulating layers positioned between the hard bias layers and the first lead layer and the second lead layer, wherein a thickness of each of the hard bias layers is at least five times a thickness of the free layer of the sensor; the method comprising:
   applying the current sufficiently to generate a sensor magnetic field opposite the hard bias magnetic field at a center ef the track width of the sensor.

12. The method as recited in claim 11, wherein at least one of the leads is at least as wide as the track width of the sensor.

13. The method as recited in claim 11, both of the leads are at least as wide as the track width of the sensor.

14. The method as recited in claim 11, wherein the current is applied to ensure that the sensor magnetic field generated by the current is opposite and substantially equal to the hard bias magnetic field at the center of the track width of the sensor.

15. The method as recited in claim 11, wherein a thickness of each of the hard bias layers is at least eight times a thickness of the free layer of the sensor.

16. The method as recited in claim 15, wherein a thickness of each of the hard bias layers is at least ten times a thickness of the free layer of the sensor.

17. The method as recited in claim 11, wherein the current includes 5–10 mA of current.

18. The method as recited in claim 17, wherein the current includes 6–8 mA of current.

19. The method as recited in claim 18, wherein the current includes 7 mA of current.

20. The method as recited in claim 11, wherein a sensitivity of the sensor device is enhanced by ensuring that the sensor magnetic field generated by the current is opposite and substantially equal to the hard bias magnetic field at the center of the track width of the sensor.

21. A magnetic tunnel junction (MTJ) sensor device, comprising:
a first lead layer;
a sensor including;
a pinned layer,
a free layer adjacent to the pinned layer, the magnetization direction of the pinned layer being substantially perpendicular to the magnetization direction of the free layer at zero applied magnetic field,
a tunnel barrier layer positioned between the pinned layer and the free layer,
wherein the pinned layer, the free layer, and the tunnel barrier layer define a track width;
a second lead layer, where the pinned layer, the free layer, and the tunnel barrier layer are positioned between the first lead layer and the second lead layer, the first lead layer and the second lead layer conducting 5–10 mA of current through the sensor;
a pair of hard bias layers adjacent to the pinned layer, the free layer, and the tunnel barrier layer for generating a hard bias magnetic field, wherein a thickness of each of the hard bias layers is a least five times a thickness of the free layer of the sensor; and
insulating layers positioned between the hard bias layers and the first lead layer and the second lead layer;
wherein a sensor magnetic field generated by the current is opposite and substantially equal to the hard bias magnetic field at a center of the track width of the sensor for enhancing a sensitivity of the sensor device.

22. A disk drive system, comprising:
a magnetic recording disk;
a magnetic tunnel junction (MTJ) sensor device including:
a first lead layer,
a sensor including:
a pinned layer,
a free layer adjacent to the pinned layer, the magnetization
direction of the pinned layer being substantially perpendicular to the
magnetization direction of the free layer at zero applied magnetic field,
a tunnel barrier layer positioned between the pinned layer and the
free layer,
wherein the pinned layer, the free layer, and the tunnel barrier
layer define a track width,
a second lead layer, where the pinned layer, the free layer, and the tunnel barrier layer are positioned between the first lead layer and the second lead layer, the first lead layer and the second lead layer adapted for conducting a current through the sensor,
a pair of hard bias layers adjacent to the pinned layer, the free layer, and
the tunnel barrier layer for generating a hard bias magnetic field, and
insulating layers positioned between the hard bias layers and the first
lead layer and the second lead layer,
wherein a sensor magnetic field generated by the current is opposite the
hard bias magnetic field at a center of the track width of the sensor;
wherein at least one of the leads is at least as wide as the track width of
the sensor,
wherein a thickness of each of the hard bias layers is at least five times a
thickness of the free layer of the sensor,
an actuator for moving the MTJ sensor across the magnetic recording disk so the MTJ sensor may access different regions of magnetically recorded data on the magnetic recording disk; and
a controller electrically coupled to the MTJ sensor for detecting changes in resistance of the MTJ sensor.

* * * * *

UNITED STATES PATENT AND TRADEMARK OFFICE
CERTIFICATE OF CORRECTION

PATENT NO. : 7,154,716 B2
APPLICATION NO. : 10/452561
DATED : December 26, 2006
INVENTOR(S) : Gill It is certified that error appears in the above-identified patent and that said Letters Patent is hereby corrected as shown below:

In the claims:
col. 8, line 22 change "senscr" to --sensor--;
col. 8, line 32 change "devwe" to --device--;
col. 8, line 35 change "sensetivitv" to --sensetivity--;
col. 8, line 43 change "1eads" to --leads--;
col. 8, line 54 change "tunnel barrier" to --tunnel barrier layer--;
col. 8, line 67 change "center ct" to --center of--;
col. 9, line 49 change "a least" to --at least--.

Signed and Sealed this

Third Day of April, 2007

JON W. DUDAS
*Director of the United States Patent and Trademark Office*